United States Patent
Derderian et al.

(10) Patent No.: US 7,838,084 B2
(45) Date of Patent: *Nov. 23, 2010

(54) ATOMIC LAYER DEPOSITION METHOD OF DEPOSITING AN OXIDE ON A SUBSTRATE

(75) Inventors: Garo J. Derderian, Boise, ID (US); Shuang Meng, Boise, ID (US); Danny Dynka, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 1090 days.

This patent is subject to a terminal disclaimer.

(21) Appl. No.: 11/491,383

(22) Filed: Jul. 20, 2006

(65) Prior Publication Data
US 2006/0257584 A1 Nov. 16, 2006

Related U.S. Application Data

(63) Continuation of application No. 10/733,201, filed on Dec. 9, 2003, now Pat. No. 7,431,966.

(51) Int. Cl.
*H05H 1/24* (2006.01)
*B05D 19/00* (2006.01)
*C23C 16/00* (2006.01)
*C23C 16/06* (2006.01)

(52) U.S. Cl. .............. 427/569; 427/255.28; 427/126.3; 427/255.31; 427/255.32; 427/255.34; 427/255.37

(58) Field of Classification Search ............... 427/569, 427/255.25, 126.3
See application file for complete search history.

(56) References Cited

U.S. PATENT DOCUMENTS

| 4,652,463 | A | * | 3/1987 | Peters ..................... 427/584 |
| 6,960,537 | B2 | * | 11/2005 | Shero et al. ................. 438/775 |
| 7,431,966 | B2 | * | 10/2008 | Derderian et al. ...... 427/255.28 |
| 2001/0041250 | A1 | * | 11/2001 | Werkhoven et al. ......... 428/212 |
| 2003/0143319 | A1 | | 7/2003 | Park et al. |
| 2006/0009044 | A1 | | 1/2006 | Igeta et al. |
| 2006/0174833 | A1 | | 8/2006 | Yamazaki et al. |

* cited by examiner

*Primary Examiner*—Timothy Meeks
*Assistant Examiner*—Kelly M Gambetta
(74) *Attorney, Agent, or Firm*—Wells St. John P.S.

(57) ABSTRACT

The invention includes atomic layer deposition methods of depositing an oxide on a substrate. In one implementation, a substrate is positioned within a deposition chamber. A first species is chemisorbed onto the substrate to form a first species monolayer within the deposition chamber from a gaseous precursor. The chemisorbed first species is contacted with remote plasma oxygen derived at least in part from at least one of $O_2$ and $O_3$ and with remote plasma nitrogen effective to react with the first species to form a monolayer comprising an oxide of a component of the first species monolayer. The chemisorbing and the contacting with remote plasma oxygen and with remote plasma nitrogen are successively repeated effective to form porous oxide on the substrate. Other aspects and implementations are contemplated.

29 Claims, 7 Drawing Sheets

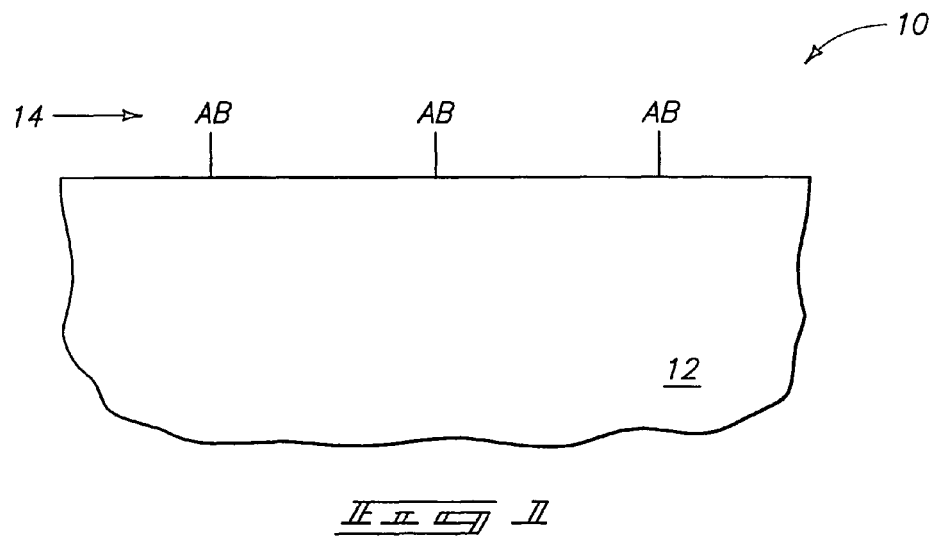
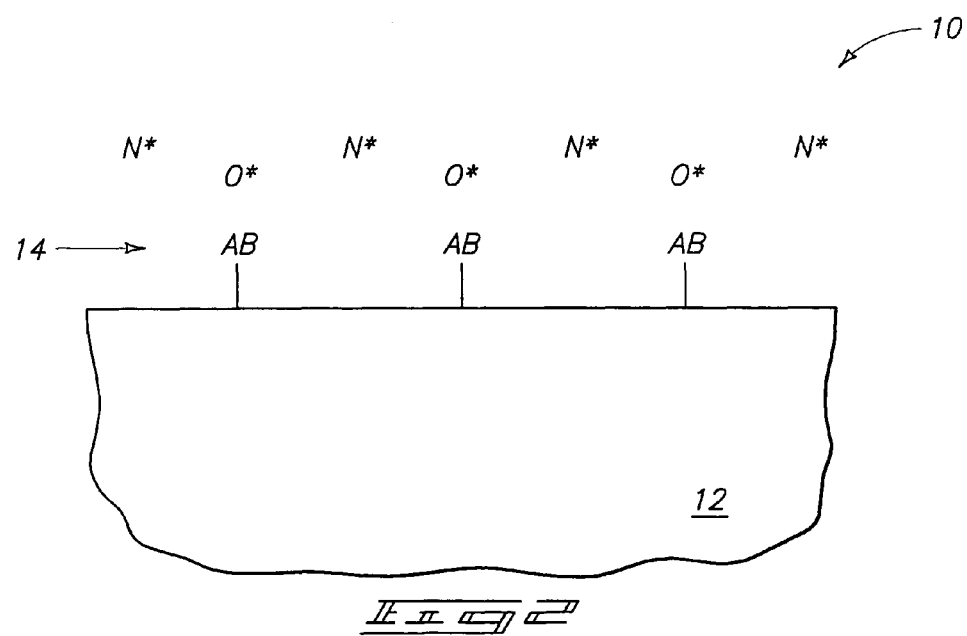

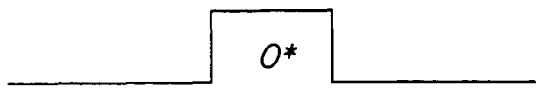
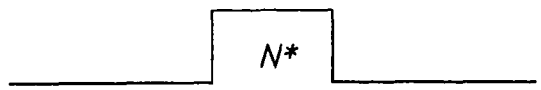
FIG. 9
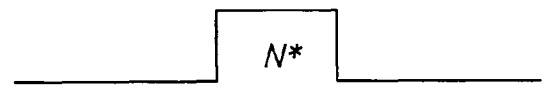
FIG. 10
FIG. 11

US 7,838,084 B2

ATOMIC LAYER DEPOSITION METHOD OF DEPOSITING AN OXIDE ON A SUBSTRATE

RELATED PATENT DATA

This patent resulted from a continuation application of U.S. patent application Ser. No. 10/733,201, filed Dec. 9, 2003, entitled "Atomic Layer Deposition Method of Depositing an Oxide on a Substrate", naming Garo J. Derderian, Shuang Meng and Danny Dynka as inventors, the disclosure of which is incorporated by reference.

TECHNICAL FIELD

This invention relates to atomic layer deposition methods of depositing an oxide on a substrate.

BACKGROUND OF THE INVENTION

Integrated circuits are typically formed on a semiconductor substrate such as a silicon wafer or other semiconductive material. In general, layers of various materials, which are one of semiconductive, conducting or insulating, are used to form the integrated circuits. By way of example, the various materials are doped, ion implanted, deposited, etched, grown, etc., using various processes. A continuing goal in semiconductor processing is to reduce the size of individual electronic components, thereby enabling smaller and denser integrated circuitry.

As semiconductor devices continue to shrink geometrically, such has had a tendency to result in greater shrinkage in the horizontal dimension than in the vertical dimension. In some instances, the vertical dimension increases. Regardless, the result is increased aspect ratios (height to width) of the devices, making it increasingly important to develop processes that enable materials to conformally deposit over the surfaces of high aspect ratio features. One such processing is atomic layer deposition, which involves the deposition of successive monolayers over a substrate within a deposition chamber typically maintained at subatmospheric pressure. With typical atomic layer deposition, successive monoatomic layers are adsorbed to a substrate and/or reacted with the outer layer on the substrate, typically by the successive feeding of different deposition precursors to the substrate surface.

One commonly used class of materials in the fabrication of integrated circuitry is oxides. Some oxides are electrically conductive, while other oxides are electrically insulative.

While the invention was motivated in addressing the above issues, it is in no way so limited. The invention is only limited by the accompanying claims as literally worded, without interpretative or other limiting reference to the specification, and in accordance with the doctrine of equivalents.

SUMMARY

The invention includes atomic layer deposition methods of depositing an oxide on a substrate. In one implementation, a substrate is positioned within a deposition chamber. A first species is chemisorbed onto the substrate to form a first species monolayer within the deposition chamber from a gaseous precursor. The chemisorbed first species is contacted with remote plasma oxygen derived at least in part from at least one of $O_2$ and $O_3$ and with remote plasma nitrogen effective to react with the first species to form a monolayer comprising an oxide of a component of the first species monolayer. The chemisorbing and the contacting with remote plasma oxygen and with remote plasma nitrogen are successively repeated effective to form porous oxide on the substrate.

Other aspects and implementations are contemplated.

BRIEF DESCRIPTION OF THE DRAWINGS

Preferred embodiments of the invention are described below with reference to the following accompanying drawings.

FIG. 1 is a diagrammatic depiction of a substrate in process in accordance with an aspect of the invention.

FIG. 2 is a view of the FIG. 1 substrate at a processing step subsequent to that depicted by FIG. 1.

FIG. 9 is a diagrammatic depiction of gas flow as a function of time.

FIG. 10 is an alternate diagrammatic depiction of gas flow as a function of time.

FIG. 11 is an alternate diagrammatic depiction of gas flow as a function of time.

DETAILED DESCRIPTION OF THE PREFERRED EMBODIMENTS

Figure 3:
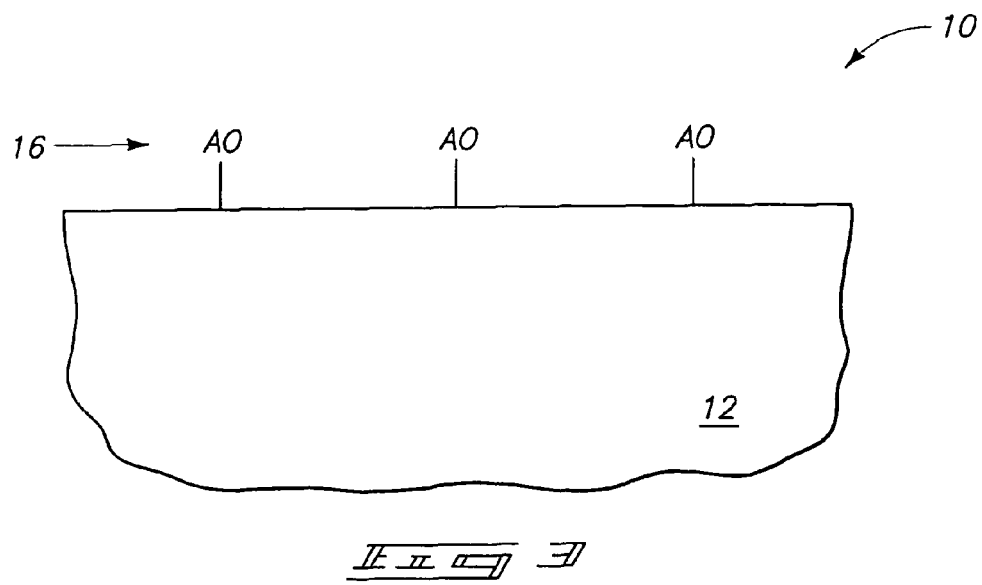
FIG. 3 is a view of the FIG. 2 substrate at a processing step subsequent to that depicted by FIG. 2.

This disclosure of the invention is submitted in furtherance of the constitutional purposes of the U.S. Patent Laws "to promote the progress of science and useful arts" (Article 1, Section 8).

The invention comprises atomic layer deposition methods of depositing oxides on substrates. Atomic layer depositing (ALD) typically involves formation of successive atomic layers on a substrate. Described in summary, ALD includes exposing an initial substrate to a first chemical species to accomplish chemisorbtion of the species onto the substrate. Theoretically, the chemisorbtion forms a monolayer that is uniformly one atom or molecule thick on the entire exposed initial substrate. In other words, a saturated monolayer is preferably formed. Practically, chemisorbtion might not occur on all portions or completely over the desired substrate surfaces. Nevertheless, such an imperfect monolayer is still considered a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. Further, one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include nitrogen, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. Further, local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

An exemplary preferred embodiment is initially described with reference to FIGS. 1-5. Referring to FIG. 1, there diagrammatically depicted is a substrate fragment 10. In one exemplary embodiment, substrate fragment 10 is a semiconductor substrate, for example comprising a substrate 12 comprising some material which preferably includes some semiconductive material and may, of course, include multiple materials and layers. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 12 is positioned within a suitable deposition chamber. A first species AB has been chemisorbed to form a first species monolayer 14 onto substrate 12 within the deposition chamber from a suitable gaseous precursor.

Referring to FIGS. 2 and 3, chemisorbed first species AB has been contacted with remote plasma oxygen derived at least in part from $O_2$ and $O_3$ and with remote plasma nitrogen (FIG. 2) effective to react with first species AB to form a monolayer 16 (FIG. 3) comprising an oxide AO of a component (i.e., A) of the first species monolayer. The chemisorbing and the contacting with remote plasma oxygen and with remote plasma nitrogen are successively repeated effective to form porous oxide on the substrate. The same or different gaseous precursors for the stated chemisorbings and contactings can be utilized. It has been discovered that the provision of remote plasma nitrogen (even and preferably in small amounts) has the effect of forming the oxide to be porous, whereas otherwise identical processing in the absence of remote plasma nitrogen does not result in any appreciable porosity in the oxide layer formed.

Figure 4:
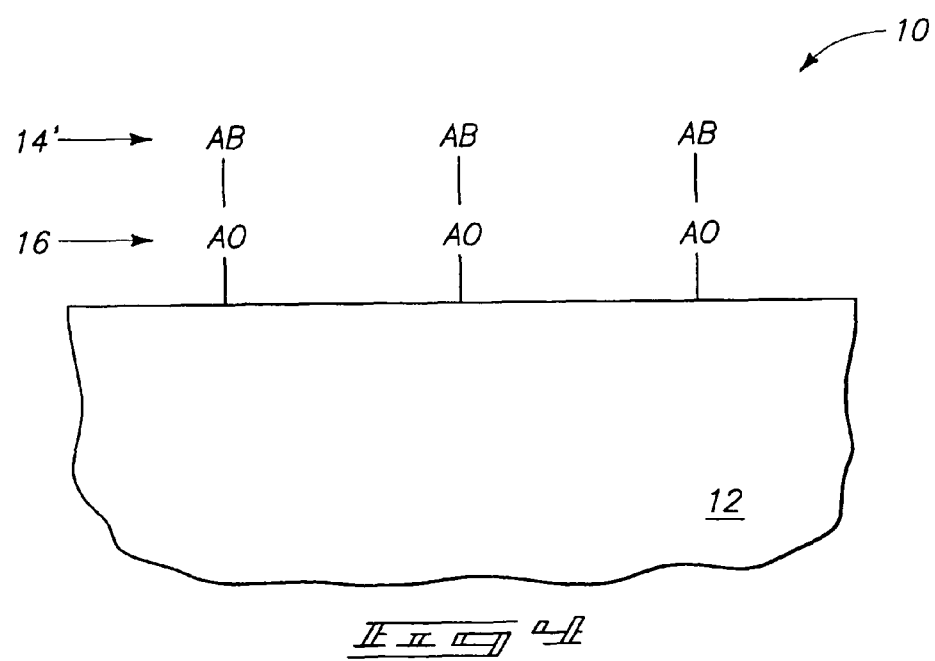
FIG. 4 is a view of the FIG. 3 substrate at a processing step subsequent to that depicted by FIG. 3.
Figure 5:
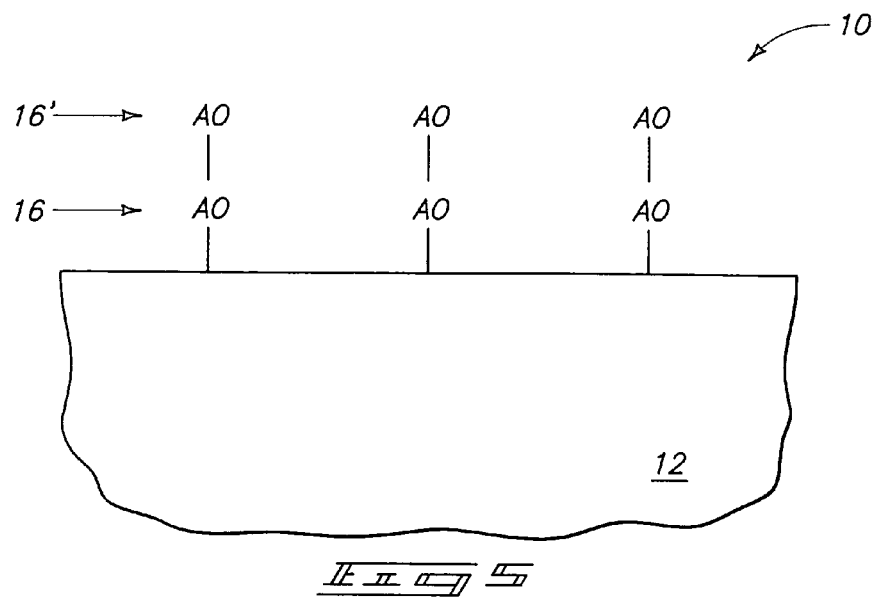
FIG. 5 is a view of the FIG. 4 substrate at a processing step subsequent to that depicted by FIG. 4.

FIG. 4 depicts exemplary repeating of chemisorbing of first species AB to form a first species monolayer 14' onto oxide AO. FIG. 5 depicts successive contacting with remote plasma oxygen and remote plasma nitrogen effective to form a monolayer 16' comprising oxide AO of a component of first species monolayer 14'.

The porous oxide which is formed might be an electrically insulative oxide or an electrically conductive oxide. By way of example only, exemplary preferred insulative oxides include $SiO_2$ and $Al_2O_3$. Further by way of example only, exemplary preferred electrically conductive oxides include tin oxide and indium oxide. By way of example only, for the formation of porous $Al_2O_3$, an exemplary gaseous precursor for chemisorbing the first species is trimethyl aluminum, with a likely first species being aluminum chemisorbed to the substrate, with methyl groups pending from the chemisorbed aluminum. Accordingly, the contacting with remote plasma oxygen and with remote plasma nitrogen forms an oxide with an aluminum component of the first species monolayer.

By way of example only, where the porous oxide comprises $SiO_2$, an exemplary gaseous precursor comprises at least one of tetraethylorthosilicate (TEOS) and a silane. Accordingly, the chemisorbed first species will comprise silicon, which will combine with the remote plasma oxygen to form an oxide. Further by way of example only, where the porous oxide comprises tin oxide, an exemplary gaseous precursor is trimethyl tin. Accordingly, the chemisorbed first species will comprise tin, which combines with the remote plasma oxygen to form tin oxide. Further by way of example only, where the porous oxide comprises indium oxide, an exemplary gaseous precursor is trimethyl indium. Accordingly, the chemisorbed first species will comprise indium, which combines with the remote plasma oxygen to form indium oxide.

Further by way of example only, the porous oxide might comprise multiple cations. By way of example only, one such porous oxide comprises $In_xSn_yO$, which is an electrically conductive oxide. By way of example only, exemplary indium and tin precursors are trimethyl tin and trimethyl indium. Such might be fed to the deposition chamber simultaneously in desired ratios towards achieving the desired quantity of tin and indium in the oxide being formed. Further by way of example only, such simultaneous feeding might be as a mixture or separately to the chamber. Further by way of example only, the tin containing precursor and the indium containing precursor might be fed to the deposition chamber at different times. Such different times might overlap with one another, or be spaced from one another such that there is no overlap.

Figure 6:
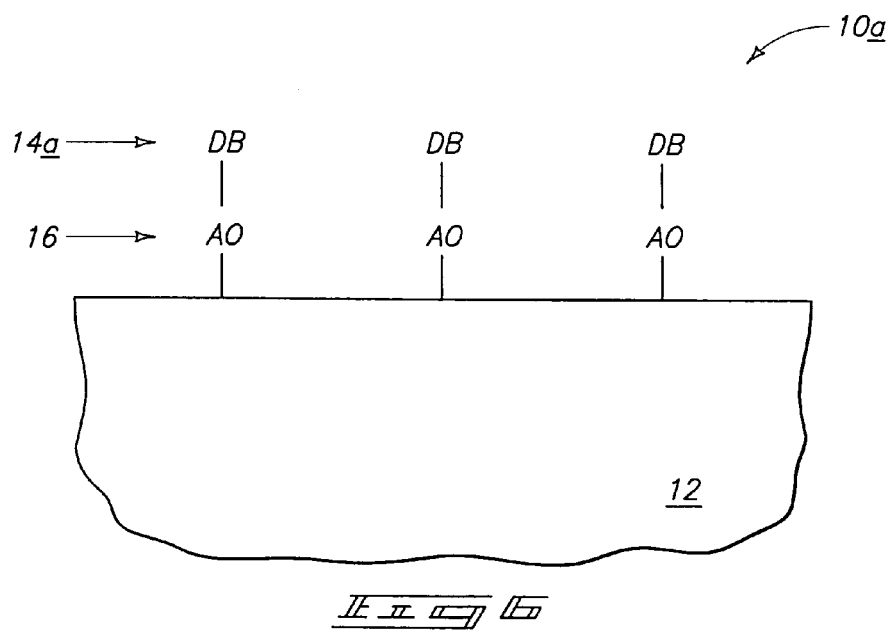
FIG. 6 is an alternate view of the FIG. 3 substrate at a processing step subsequent to that depicted by FIG. 3.

By way of example only, FIG. 6 diagrammatically depicts an alternate embodiment substrate fragment 10a. Like numerals from the first described embodiment are utilized where appropriate, with differences being designated with different letters or with the suffix "a". Substrate fragment 10a is shown at a processing step subsequent to that depicted by FIG. 3 with respect to substrate fragment 10. A first species DB has been chemisorbed to form a first species monolayer 14a onto the substrate, here onto species AO, within the deposition chamber from a suitable gaseous precursor. For example, and by way of example only, oxide AO might comprise one or the other of tin oxide and indium oxide, with first species DB comprising the other of a tin or indium containing species, and with "D" designating one of the tin or indium, and the "A" designating the other of tin or indium.

Figure 7:
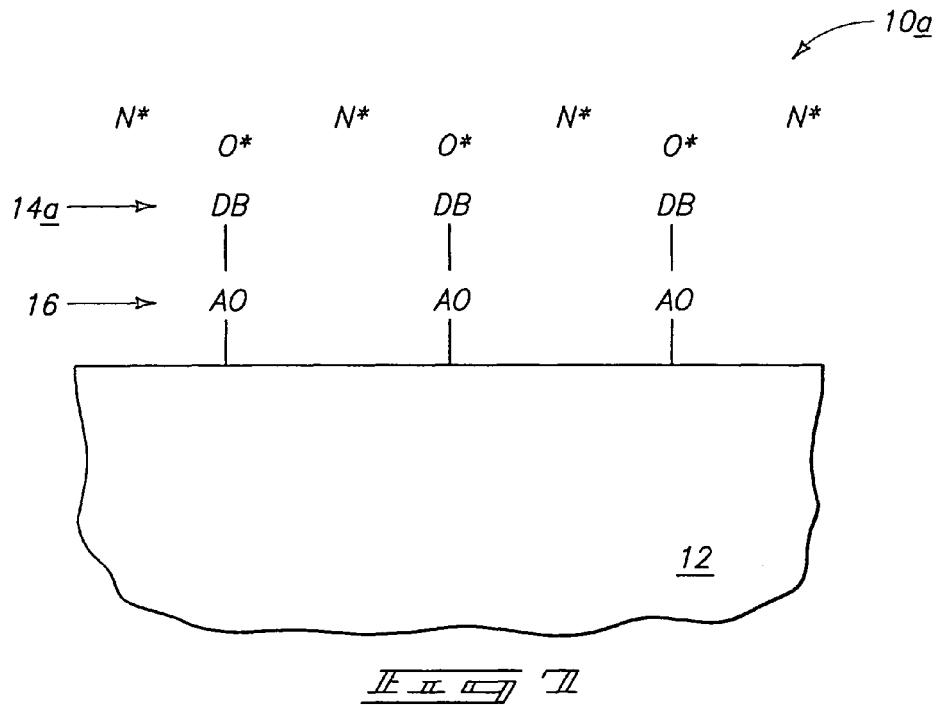
FIG. 7 is a view of the FIG. 6 substrate at a processing step subsequent to that depicted by FIG. 6.
Figure 8:
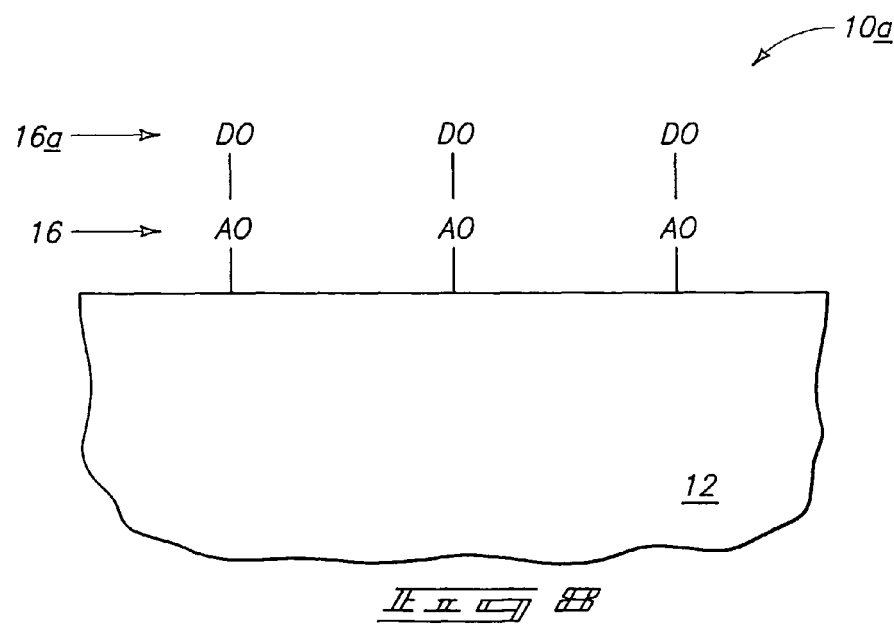
FIG. 8 is a view of the FIG. 7 substrate at a processing step subsequent to that depicted by FIG. 7.

Referring to FIGS. 7 and 8, chemisorbed first species DB is contacted with remote plasma oxygen and with remote plasma nitrogen (FIG. 7) effective to react with first species DB to form a monolayer 16a (FIG. 8) comprising an oxide DO of a component (i.e., component D) of first species monolayer 14a. Of course, the illustrated monolayers 16 and 16a might respectively include combinations of the A and D exemplified oxides, as well as the same oxide molecules bonding to one another.

Exemplary preferred remote plasma nitrogen is derived from any one or combination of $N_2$, $N_2O$ and $NO_x$. Further, the remote plasma oxygen might comprise one or a combination of $O_2$ and $O_3$.

The remote plasma oxygen and the remote plasma nitrogen are most preferably fed to the deposition chamber simultaneously, meaning over the same identical time interval (for example as depicted in FIG. 9). Alternately, the remote plasma oxygen and the remote plasma nitrogen are fed separately to the deposition chamber at different times. The different times might overlap one another (for example as depicted in FIG. 10), or the different times might be spaced from one another such that they do not overlap (for example as depicted in FIG. 11). Further if at different times, either could precede the other.

Figure 12:
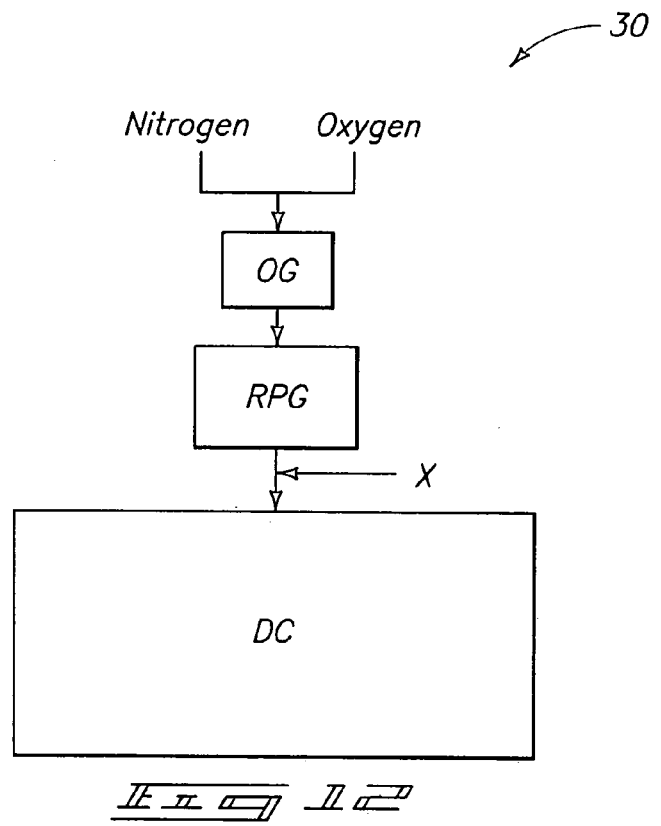
FIG. 12 is a diagrammatic depiction of a system usable in accordance with an aspect of the invention.

In one preferred implementation, the remote plasma oxygen and the remote plasma nitrogen are fed as a mixture to the deposition chamber. FIG. 12 depicts a most preferred and reduction-to-practice embodiment 30. A nitrogen stream and a stream comprising at least one of $O_2$ and $O_3$ are mixed and fed to an ozone generator OG. Ozone generator OG can be "off" or "on", and if "on" will convert a portion of the $O_2$ to $O_3$. Regardless, the mixed stream is depicted as then feeding to a remote plasma generator RPG wherein a remote plasma mixture is generated. Accordingly in this depicted embodiment, remote plasma oxygen and remote plasma nitrogen are generated in the same remote plasma generating chamber. Such is then depicted as being fed as a mixture to a deposition chamber DC within which the substrate being deposited upon is received. A gaseous feed line X is depicted downstream of remote plasma generator RPG. More streams might be provided, as well as before or after remote plasma generator RPG. Such could constitute one or more other gaseous precursor streams and/or inert purge gas or carrier gas streams.

Figure 13:
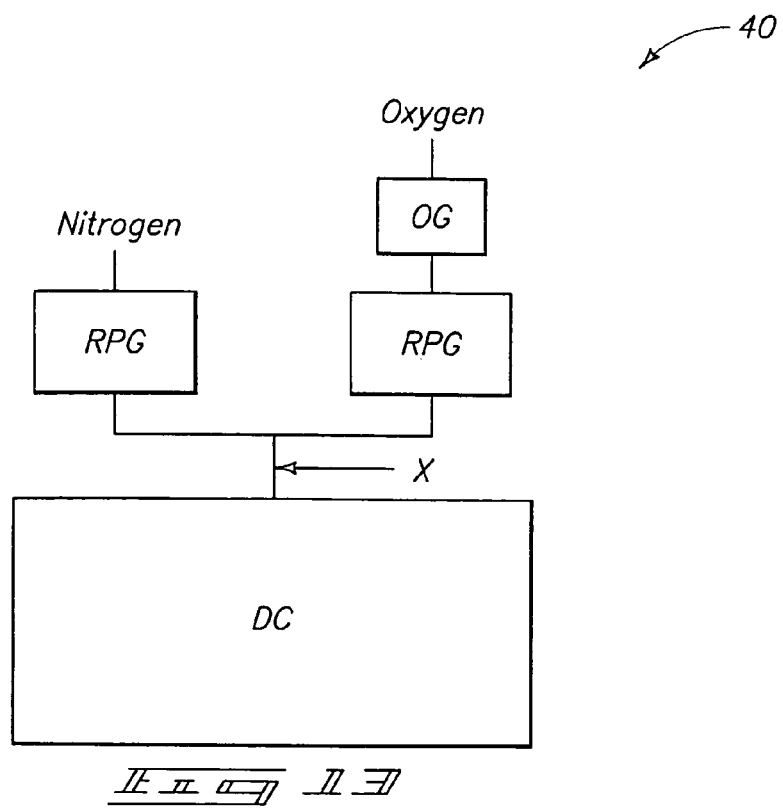
FIG. 13 is an alternate diagrammatic depiction of a system usable in accordance with an aspect of the invention.
Figure 14:
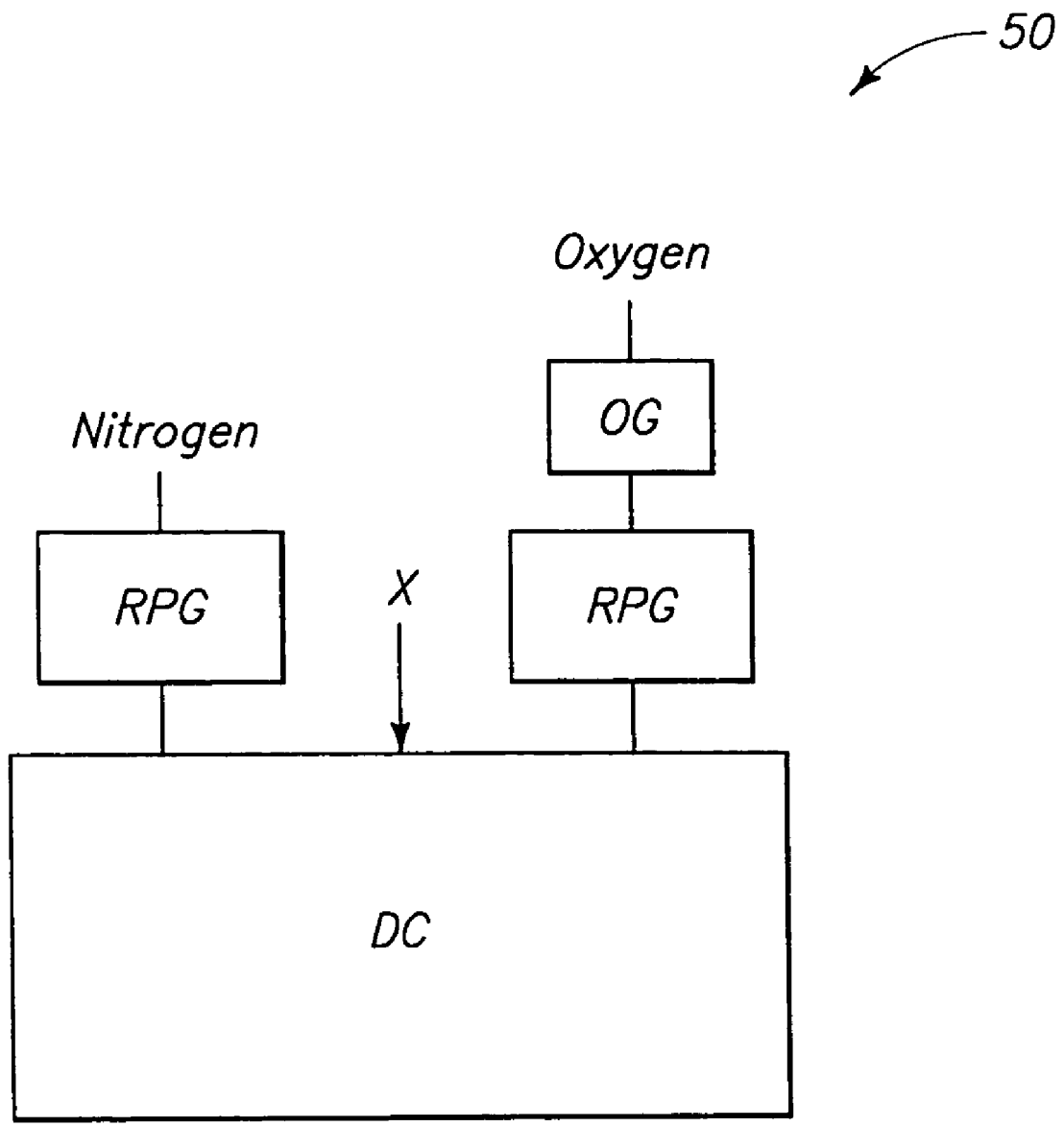
FIG. 14 is an alternate diagrammatic depiction of a system usable in accordance with an aspect of the invention.

By way of example only, an alternate lesser preferred embodiment system 40 is depicted in FIG. 13. Here, remote plasma oxygen derived at least from at least one of $O_2$ and $O_3$ and remote plasma nitrogen are generated in different remote plasma generating chambers RPG and then mixed prior to feeding to deposition chamber DC. Further by way of example only, FIG. 14 depicts another alternate embodiment system 50. Here, the remote plasma oxygen and the remote plasma nitrogen are fed separately to the deposition chamber, for example either simultaneously or at different times.

Regardless of whether mixing or fed separately, when the remote plasma oxygen and the remote plasma nitrogen are fed to the deposition chamber at the same time, a preferred quantity or concentration of the remote plasma nitrogen is from 0.01% to 90% by volume of all remote plasma oxygen and remote plasma nitrogen fed to the deposition chamber. More preferably, the remote plasma nitrogen is from 0.1% to 10%, and more preferably from 0.1% to 3% by volume of all remote plasma oxygen and remote plasma nitrogen fed to the deposition chamber. Very low quantities of remote plasma nitrogen have been found effective to produce porous oxide in accordance with the invention, with another preferred concentration range for the remote plasma nitrogen being from 0.01% to 1% by volume of all remote plasma oxygen and remote plasma nitrogen fed to the deposition chamber.

An exemplary preferred temperature range for the stated chemisorbings and contactings is from 100° C. to 500° C., and more preferably from 200° C. to 350° C. Exemplary preferred pressure within the chamber during the stated chemisorbings and contactings is from 200 mTorr to 10 Torr, with from 500 mTorr to 2.5 Torr being more preferred. An exemplary preferred remote plasma generating power is from 1000 watts to 6000 watts, with 4000 watts being a specific example. An exemplary preferred frequency for the remote plasma generation is 13.5 mHz, with such powers and frequencies being for an exemplary total two liters feed of gases to the remote plasma generator. Of course, some of the remote plasma material generated might be diverted to not flow to the chamber. Further, the chamber might, of course, be a cold wall reactor or a hot wall reactor.

The invention was reduced-to-practice utilizing the embodiment system of FIG. 12 with $O_2$, $N_2$, and trimethyl aluminum in the formation of $Al_2O_3$. Average temperature and pressure during the chemisorbings and contactings was 300° C. and 1 Torr, respectively. Remote plasma power was 4000 watts at a frequency of 13.5 mHz for a flow rate of two liters per minute of a mixture of $N_2$ and $O_2$ to the ozone generator and remote plasma generator, with 10 sccm thereof being nitrogen, providing a ratio of remote plasma nitrogen at 0.5% by volume of all remote plasma oxygen and remote plasma nitrogen fed to the deposition chamber. The trimethyl aluminum pulsings were at a flow rate of 30 sccm for from 0.8 second to 2 seconds, followed by purging with an inert gas at from 500 sccm to 1000 sccm for from 5 seconds to 10 seconds, followed by feeding of the mixture of remote plasma nitrogen and remote plasma oxygen for from 6 seconds to 10 seconds, followed by purging with an inert gas at from 500 sccm to 1000 sccm for from 5 seconds to 10 seconds. Such processing was successively repeated, resulting in approximately 1.2 Angstroms of oxide formation per complete cycle. The oxide that formed had approximately 50% porosity with substantially close-celled pores. The degree of porosity is expected to be modifiable by manipulating various of the above-stated exemplary parameters. Without being limited by any theory of invention, it is believed that the remote plasma nitrogen might be contributing to the formation of some nitride material which then reacts with oxygen to substantially remove nitrogen from being formed in the oxide layer and generating pores in the oxide in the process.

The invention was reduced-to-practice and considered in the fabrication of integrated circuitry in semiconductor processing. However, porous oxides have other uses beyond integrated circuitry fabrication, with the invention not being so limited. By way of example only, exemplary uses for the technology would be to insulate sidewalls of deep structures, or steep sidewalls and steep steps, or in forming very low k insulator layers as well as conductive layers, in integrated circuitry fabrication. Further, porous oxides formed in accordance with the invention may have a myriad of other uses, whether existing or yet-to-be developed, for example as anti-reflective coatings in semiconductor processing or on display screens; as coatings in photolithography; as mechanical, chemical or chemical/mechanical fluid filters; as catalyst support beds, etc.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents. For example and by way of example only, the invention does not preclude and contemplates combination of the claimed atomic layer depositing with other deposition methods before or after the claimed atomic layer depositing in forming porous oxide on the substrate.

The invention claimed is:

1. An atomic layer deposition method of depositing an oxide on a substrate comprising:
    chemisorbing a first species onto a substrate to form a first species monolayer onto the substrate from a gaseous precursor, the first species monolayer being at least substantially saturated;
    contacting the chemisorbed first species with an oxygen plasma derived at least in part from at least one of $O_2$ and $O_3$ and generated remote from the substrate, and with a plasma nitrogen generated remote from the substrate, effective to react with the first species to form a monolayer that is at least substantially saturated and comprises an oxide of a component of the first species monolayer, the remote plasma oxygen and the remote plasma nitrogen being generated in different remote plasma generating chambers; and
    successively repeating the chemisorbing and the contacting with remote plasma oxygen and with remote plasma nitrogen effective to form porous oxide on the substrate.

2. The method of claim 1 wherein the successive repeating utilizes the same gaseous precursor during all of said successive repeating.

3. The method of claim 1 wherein the porous oxide comprises electrically insulative oxide.

4. The method of claim 1 wherein the porous oxide comprises electrically conductive oxide.

5. The method of claim 1 wherein the porous oxide comprises multiple different cations.

6. The method of claim 1 wherein the gaseous precursor comprises trimethyl aluminum, the component comprises aluminum, and the porous oxide comprises $Al_2O_3$.

7. The method of claim 1 wherein the gaseous precursor comprises at least one of TEOS and a silane, the component comprises silicon, and the porous oxide comprises $SiO_2$.

8. The method of claim 1 wherein the gaseous precursor comprises trimethyl tin, the component comprises tin, and the porous oxide comprises tin oxide.

9. The method of claim 1 wherein the gaseous precursor comprises trimethyl indium, the component comprises indium, and the porous oxide comprises indium oxide.

10. The method of claim 1 wherein the gaseous precursor comprises trimethyl tin, the gaseous precursor comprises trimethyl indium, and the porous oxide comprises $In_xSn_yO$.

11. The method of claim 1 wherein the remote plasma nitrogen is derived at least in part from $N_2$.

12. The method of claim 11 wherein nitrogen of the remote plasma nitrogen is derived entirely from $N_2$.

13. The method of claim 1 wherein the remote plasma nitrogen is derived at least in part from $N_2O$.

14. The method of claim 13 wherein nitrogen of the remote plasma nitrogen is derived entirely from $N_2O$.

15. The method of claim 1 wherein the remote plasma nitrogen is derived at least in part from $NO_x$.

16. The method of claim 15 wherein nitrogen of the remote plasma nitrogen is derived entirely from $NO_x$.

17. The method of claim 1 wherein the remote plasma nitrogen is from 0.1% to 10% by volume of all remote plasma oxygen and remote plasma nitrogen provided to the substrate.

18. The method of claim 17 wherein the remote plasma nitrogen is from 0.1% to 3% by volume of all remote plasma oxygen and remote plasma nitrogen provided to the substrate.

19. The method of claim 1 wherein the remote plasma nitrogen is from 0.01% to 1% by volume of all remote plasma oxygen and remote plasma nitrogen provided to the substrate.

20. An atomic layer deposition method of depositing an oxide on a substrate comprising:
    chemisorbing a first species onto a substrate to form a first species monolayer onto the substrate from a gaseous precursor, the first species monolayer being at least substantially saturated;
    contacting the chemisorbed first species with an oxygen plasma derived at least in part from at least one of $O_2$ and $O_3$ and generated remote from the substrate, and with a plasma nitrogen generated remote from the substrate, effective to react with the first species to form a monolayer that is at least substantially saturated and comprises an oxide of a component of the first species monolayer, the remote plasma oxygen and the remote plasma nitrogen being generated in different remote plasma generating chambers; and
    successively repeating the chemisorbing and the contacting with remote plasma oxygen and with remote plasma nitrogen effective to form porous oxide on the substrate comprising $In_xSn_yO$ on the substrate, the gaseous precursor comprising an indium-containing precursor and a tin-containing precursor which are fed to the deposition chamber simultaneously.

21. An atomic layer deposition method of depositing an oxide on a substrate comprising:
    chemisorbing a first species onto a substrate to form a first species monolayer onto the substrate from a gaseous precursor, the first species monolayer being at least substantially saturated;
    contacting the chemisorbed first species with an oxygen plasma derived at least in part from at least one of $O_2$ and $O_3$ and generated remote from the substrate, and with a plasma nitrogen generated remote from the substrate, effective to react with the first species to form a monolayer that is at least substantially saturated and comprises an oxide of a component of the first species monolayer, the remote plasma oxygen and the remote plasma nitrogen being generated in different remote plasma generating chambers; and successively repeating the chemisorbing and the contacting with remote plasma oxygen and with remote plasma nitrogen effective to form porous oxide on the substrate comprising $In_xSn_yO$ on the substrate, the gaseous precursor comprising an indium-containing precursor and a tin-containing precursor which are fed to the deposition chamber at different times.

22. The method of claim 21 wherein the different times overlap one another.

23. The method of claim 21 wherein the different times are spaced from one another.

24. The method of claim 1 wherein the remote plasma oxygen and the remote plasma nitrogen are fed separately to the deposition chamber.

25. The method of claim 1 wherein the remote plasma oxygen and the remote plasma nitrogen are fed as a mixture to the deposition chamber.

26. The method of claim 20 wherein the remote plasma oxygen and the remote plasma nitrogen are fed separately to the deposition chamber.

27. The method of claim 20 wherein the remote plasma oxygen and the remote plasma nitrogen are fed as a mixture to the deposition chamber.

28. The method of claim 21 wherein the remote plasma oxygen and the remote plasma nitrogen are fed separately to the deposition chamber.

29. The method of claim 21 wherein the remote plasma oxygen and the remote plasma nitrogen are fed as a mixture to the deposition chamber.

* * * * *